(12) United States Patent
Chung et al.

(10) Patent No.: US 7,488,688 B2
(45) Date of Patent: Feb. 10, 2009

(54) METHOD OF REMOVING OXIDE LAYER AND SEMICONDUCTOR MANUFACTURING APPARATUS FOR REMOVING OXIDE LAYER

(75) Inventors: Seung-pil Chung, Seoul (KR); Kyu-whan Chang, Hwasung-gun (KR); Sun-jung Lee, Seoul (KR); Kun-tack Lee, Suwon (KR); Im-soo Park, Seoul (KR); Kwang-wook Lee, Anyang (KR); Moon-hee Lee, Suwon (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 170 days.

(21) Appl. No.: 10/997,902

(22) Filed: Nov. 29, 2004

(65) Prior Publication Data

US 2005/0087893 A1    Apr. 28, 2005

Related U.S. Application Data

(62) Division of application No. 09/689,814, filed on Oct. 13, 2000, now abandoned.

(30) Foreign Application Priority Data

Oct. 25, 1999   (KR) .............................. 1999-46365

(51) Int. Cl.
*H01L 21/302* (2006.01)
(52) U.S. Cl. ........................... 438/706; 216/67
(58) Field of Classification Search ................ 414/217; 438/680, 706; 156/345.31; 118/719
See application file for complete search history.

(56) References Cited

U.S. PATENT DOCUMENTS 4,836,905 A * 6/1989 Davis et al. ............ 204/298.25
4,936,940 A   6/1990 Kawasumi et al.
5,290,381 A   3/1994 Nozawa et al.
5,328,558 A * 7/1994 Kawamura ................. 438/707

(Continued)

OTHER PUBLICATIONS

Wolf et al.; Silicon Processing for the VLSI; vol. 1; 1986.*

(Continued)

*Primary Examiner*—Keith D. Hendricks
*Assistant Examiner*—Patricia A George
(74) *Attorney, Agent, or Firm*—Volentine & Whitt, PLLC.

(57) ABSTRACT

A method for removing an oxide layer such as a natural oxide layer and a semiconductor manufacturing apparatus which uses the method to remove the oxide layer. A vertically movable susceptor is installed at the lower portion in a processing chamber and a silicon wafer is loaded onto the susceptor when it is at the lower portion of the processing chamber. The air is exhausted from the processing chamber to form a vacuum condition therein. A hydrogen gas in a plasma state and a fluorine-containing gas are supplied into the processing chamber to induce a chemical reaction with the oxide layer on the silicon wafer, resulting in a reaction layer. Then, the susceptor is moved up to the upper portion of the processing chamber, to anneal the silicon wafer on the susceptor with a heater installed at the upper portion of the processing chamber, thus vaporizing the reaction layer. The vaporized reaction layer is exhausted out of the chamber. The oxide layer can be removed with a high selectivity while avoiding damage or contamination of the underlying layer.

19 Claims, 5 Drawing Sheets

U.S. PATENT DOCUMENTS

| | | | |
|---|---|---|---|
| 5,372,969 A * | 12/1994 | Moslehi | 438/106 |
| 5,444,217 A * | 8/1995 | Moore et al. | 219/405 |
| 5,527,417 A | 6/1996 | Iida et al. | |
| 5,610,105 A * | 3/1997 | Vines et al. | 438/789 |
| 5,781,693 A * | 7/1998 | Ballance et al. | 392/416 |
| 5,863,327 A | 1/1999 | Thakur | |
| 6,143,081 A | 11/2000 | Shinriki et al. | |
| 6,182,603 B1 * | 2/2001 | Shang et al. | 118/723 ME |
| 6,189,484 B1 * | 2/2001 | Yin et al. | 118/723 I |
| 6,203,657 B1 | 3/2001 | Collison et al. | |
| 6,284,048 B1 | 9/2001 | Van Bilsen et al. | |
| 6,313,042 B1 * | 11/2001 | Cohen et al. | 438/734 |

OTHER PUBLICATIONS

Thomas Corporation. (How Products Are Made; vol. 1; LEDs; The Manufacturing Process: Making Semiconductor Wafers; 2006).*

Claflin et al. (Interface studies of tungsten nitride and titanium nitride composite metal gate electrodes with thin dielectric layers; May/Jun. 1998; J. Vac. Sci. Technol. A 16(3), 0734-2101/98/16(3)/1757/5).*

Kim et al. (Etch-Induced Physical Damage . . . Plasmas; J. Electrochem. Soc. vol. 146, Issue 4, pp. 1517-1522; Apr. 1999).*

* cited by examiner

METHOD OF REMOVING OXIDE LAYER AND SEMICONDUCTOR MANUFACTURING APPARATUS FOR REMOVING OXIDE LAYER

CROSS REFERENCES TO RELATED APPLICATIONS

This application is a divisional of U.S. patent application Ser. No. 09/689,814 filed on 13 Oct. 2000, currently abandoned the entirety of which is hereby incorporated by reference in its entirety for all purposes and claims priority under 35 U.S.C. 119 to Korean Application No. 1999-46365 filed on 25 Oct. 1999.

BACKGROUND OF THE INVENTION

1. Field of the Invention

The present invention relates to a method of manufacturing semiconductor devices, and more particularly, to a method of eliminating an oxide layer such as a natural oxide layer, and a semiconductor manufacturing apparatus for use in the removal of the oxide layer.

2. Description of the Related Art

Silicon wafers are susceptible to react with oxygen or moisture in the air, and thus a silicon dioxide ($SiO_2$) layer, which deteriorates the characteristics of a semiconductor device, is formed on the surface of a silicon wafer by spontaneous oxidation. For example, if such a natural oxide layer is formed on the surface of contacts, contact resistance increases. Also, if a natural oxide layer is formed before growth of a gate oxide layer, the characteristics of the gate oxide layer can be altered or deteriorated.

The most popular method used to remove a natural oxide layer in semiconductor fabrication is a wet cleaning technique. In the wet cleaning technique, a hydrofluoric acid (HF), which has a high selectivity between the silicon dioxide to be removed and the silicon wafer, is used as an etching solution. Also, the hydrofluoric acid has an additional advantage of coating the surface of the silicon wafer with hydrogen, in addition to the intrinsic function of removing the silicon dioxide.

However, in the case of using the HF acid to eliminate an oxide layer, other manufacturing steps cannot be carried out in-situ and thus contamination more likely occurs after the cleaning process, increasing the period of time required to complete the overall manufacturing process.

Another disadvantage is that cleaning step with the HF acid must be accompanied by a drying process. However, it is not possible to control the contamination that may occur during the drying process.

In addition, when a semiconductor wafer to be cleaned has small, deep contact holes, inevitably the cleaning solution enters the contact holes. However, due to the intrinsic viscosity of the cleaning solution, the rinsing solution may remain in the small, deep contact holes. Thus, removal of the residues remaining after the cleaning process is also an important concern.

Alternatively, the natural oxide layer can be removed by a dry etching process. For dry etching, a reactive ion etching technique is used with a gas mixture containing tetra-fluoro methane ($CF_4$) and hydrogen ($H_2$), or tri-fluoro methane ($CHF_3$) and oxygen ($O_2$). However, the dry etching process also leaves fluorine (F) on the surface of a silicon wafer which is the underlying layer of the oxide layer. Furthermore, the amount of fluorine remaining after the dry etching process is greater compared to using the wet cleaning technique, and thus the produced semiconductor device may be deteriorated to a greater degree by the dry etching process.

Also, during the dry etching process, damage to the surface of the silicon wafer occurs by the implantation energy of the etching gas, so that the surface of the silicon wafer becomes rough, and a pn junction underneath the wafer surface may be damaged.

SUMMARY OF THE INVENTION

It is an object of the present invention to provide a method of removing an oxide layer with a high selectivity, which does not cause damage or contamination to the underlying layer of the oxide layer.

It is another object of the present invention to provide a semiconductor manufacturing apparatus capable of removing an oxide layer with a high selectivity, without causing damage or contamination to the underlying layer of the oxide layer.

The first object of the present invention is achieved by a method for removing an oxide layer, including supplying a hydrogen gas in a plasma and a fluorine-containing gas onto a silicon wafer with an oxide layer on the surface thereof to induce a chemical reaction with the oxide layer. Then, the silicon wafer is annealed to vaporize the byproduct resulting from the chemical reaction.

Preferably, the chemical reaction step and the annealing step are continuously carried out in a single chamber and repeated. For example, the chemical reaction step may be performed at the lower portion of the chamber and the annealing step may be performed at the upper portion of the chamber. Alternatively, the chemical reaction step and the annealing step may be continuously carried out in different processing modules in a single chamber. For example, the chemical reaction step and the annealing step may be performed continuously, respectively, in a downflowing module and an annealing module.

The second object of the present invention is achieved by a semiconductor manufacturing apparatus including a vertically movable susceptor installed at the lower portion of a processing chamber, for receiving a wafer thereon; a heater installed at the upper portion of the processing chamber; and a gas diffuser installed below the heater, for supplying reaction gases into the process chamber.

Preferably, the susceptor of the semiconductor manufacturing apparatus has a cooling line therein for controlling the temperature of the wafer mounted thereon. The gas diffuser may comprise: a gas supply line for receiving the reaction gases supplied via pipes installed outside the processing chamber; and a porous plate forming the bottom of the diffuser for evenly distributing the reaction gases into the processing chamber, with the diffuser in contact with the gas supply line. Preferably, the pipes comprise: a first pipe having a microwave guide for changing a gas mixture containing a hydrogen gas and a fluorine-containing gas in a predetermined ratio, or the hydrogen gas only, into a plasma state; and a second pipe for supplying the fluorine-containing gas into the processing chamber. The heater may comprise a lamp or a laser. Preferably, the laser is a neodymium (Nd)-YAG laser, a carbon dioxide ($CO_2$) laser, or an eximer laser.

In one embodiment of the present invention, a method of removing an oxide layer using the semiconductor manufacturing apparatus includes steps of: (a) placing a vertically movable susceptor at the lower portion of a processing chamber and loading a wafer onto the vertically movable susceptor; (b) supplying a cooling water or cooling gas into a cooling line in the susceptor to adjust the temperature of the wafer; (c)

flowing a hydrogen gas in a plasma state and a fluorine-containing gas into the processing chamber to induce a chemical reaction with the oxide layer on the wafer; (d) moving the susceptor up to the upper portion of the processing chamber; (e) annealing the wafer mounted on the susceptor with a heater installed at the upper portion of the processing chamber to vaporize the byproduct resulting from the chemical reaction; and (f) exhausting the vaporized byproduct out of the processing chamber. Preferably, after the step (f), the steps (b) to (f) are repeated one or more times until a predetermined thickness of the oxide layer is removed.

In supplying the hydrogen gas in a plasma state and the fluorine-containing gas into the processing chamber, the hydrogen gas and the fluorine-containing gas may be mixed in a predetermined ratio, changed into a plasma state, and then supplied into the processing chamber. Alternatively, in supplying the hydrogen gas in a plasma state and the fluorine-containing gas into the processing chamber, the hydrogen gas may be supplied in a plasma state into the processing chamber and the fluorine-containing gas is supplied in a non-plasma state into the processing chamber.

Preferably, the fluorine-containing gas is $NF_3$, $SF_6$ or $ClF_3$, and the mixing ratio of the fluorine-containing gas to the hydrogen gas is in the range of 0.1:1 to 100:1 by volume. Preferably, the gas mixture containing the hydrogen gas and the fluorine-containing gas in a predetermined ratio is supplied in a plasma state into the processing chamber together with a nitrogen gas ($N_2$) and an argon gas (Ar).

The second object of the present invention can be achieved by a semiconductor manufacturing apparatus for use in removing an oxide layer, comprising: a rotary plate installed at the lower portion of a processing chamber; a rotary motor installed at the center of the rotary plate, for rotating the rotary plate; and a loading/unloading and post-processing module, a downflowing module and an annealing module, each of which is installed on the rotary plate around the rotary motor.

Preferably, the downflowing module comprises: a susceptor installed on the rotary plate to receive a wafer; a vertically movable downflowing chamber which covers the susceptor to form an enclosed space; a gas diffuser installed at the upper portion of the downflowing chamber, for supplying reaction gases onto the wafer mounted on the susceptor; a gas supply pipe connected to the gas diffuser; and guide rings at the end portions of the downflowing chamber, providing smooth contact with the rotary plate on which the susceptor is mounted.

Preferably, the annealing module comprises: a susceptor for receiving a wafer; a vertically movable annealing chamber which covers the susceptor to form an enclosed space; a heater installed at the upper portion of the annealing chamber, for annealing the wafer; and guide rings at the end portions of the annealing chamber, providing smooth contact with the rotary plate on which the susceptor is mounted. Preferably, one or more the downflowing modules and one or more the annealing modules are installed on the rotary plate.

In another embodiment of the present invention, a method of removing an oxide layer using the semiconductor manufacturing apparatus comprises: (a) loading a wafer onto a susceptor in a loading/unloading and post-processing module installed on a rotary plate of a processing chamber; (b) operating a rotary motor installed at the center of the rotary plate to move the susceptor into the lower portion of a downflowing chamber in a downflowing module; (c) moving the downflowing chamber down so that it contacts with the susceptor and the downflowing chamber is made airtight; (d) supplying a hydrogen gas in a plasma state and a fluorine-containing gas into the downflowing chamber to induce a chemical reaction with the oxide layer on the wafer; (e) moving the downflowing chamber up to the upper portion of the downflowing module apart from the susceptor, and moving the susceptor into the lower portion of an annealing chamber in an annealing module; (f) moving the annealing chamber down so that it contacts with the rotary plate and provides an air tight seal for the annealing chamber; (g) annealing the wafer with a heater installed at the upper portion of the annealing chamber to vaporize the byproduct resulting from the chemical reaction between the reactions gas and the oxide layer on the wafer; and (h) exhausting the vaporized byproduct out of the annealing chamber. Preferably, the steps (b) to (h) are sequentially repeated one or more times.

BRIEF DESCRIPTION OF THE DRAWINGS

The above objectives and advantages of the present invention will become more apparent by describing in detail preferred embodiments thereof with reference to the attached drawings in which.

DETAILED DESCRIPTION OF THE INVENTION

Figure 1:
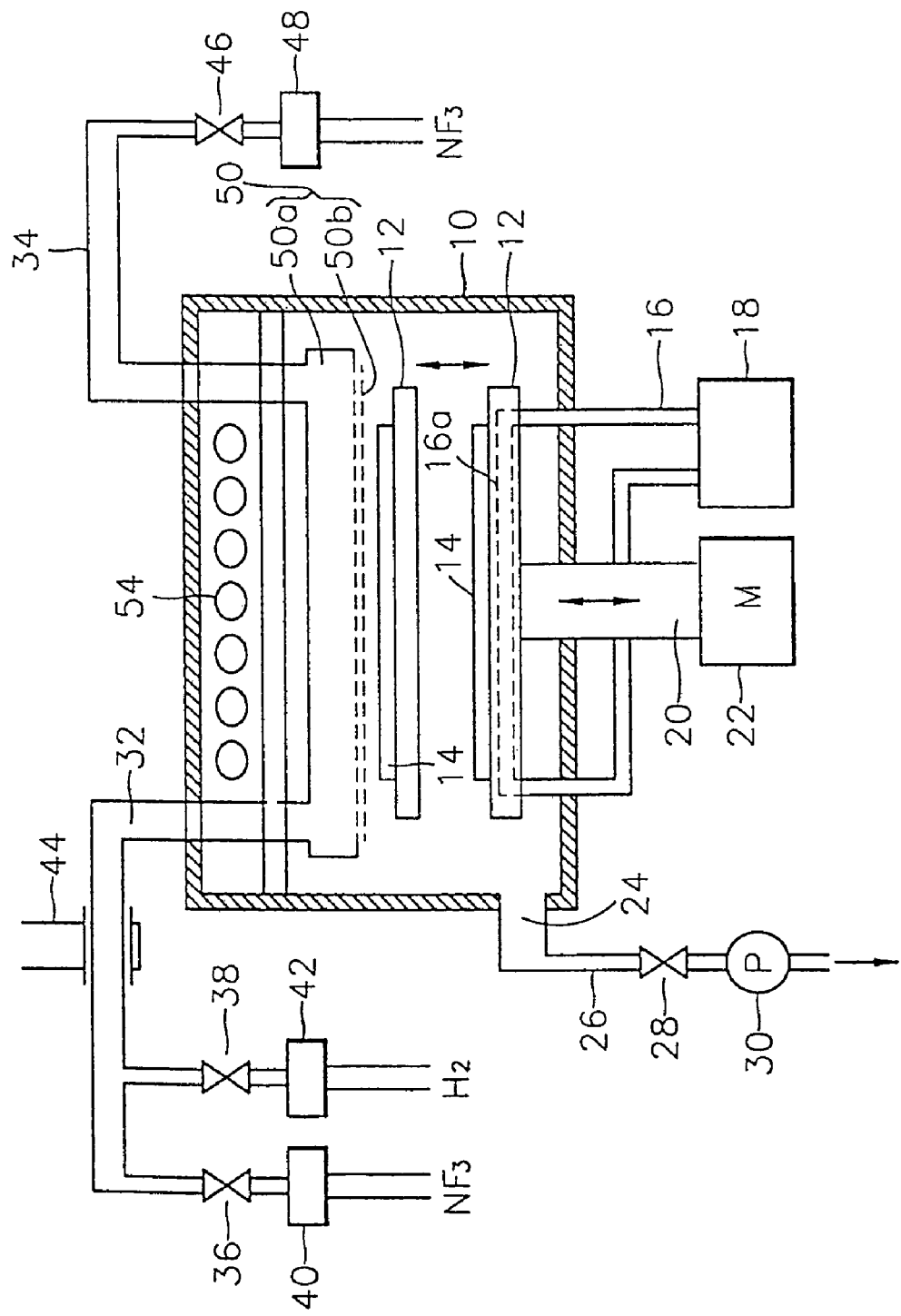
FIG. 1 is a sectional view illustrating an example of a semiconductor manufacturing apparatus which uses an oxide layer removing method according to a preferred embodiment of the present invention.

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, it is also noted that like reference numerals may be used to designate identical or corresponding parts throughout the drawings.

Method of Removing Oxide Layer

A method which is effective at removing a natural oxide layer or other oxide layers formed on a silicon wafer without causing damage to the silicon wafer will now be described. The oxide layer removing method is associated with a dry cleaning technique using a gas, rather than a wet cleaning technique performed with hydrofluoric acid (HF).

An embodiment of the oxide layer removing method relates to a dry cleaning technique using a gas mixture which contains a hydrogen gas and a fluorine-containing gas in a plasma state. In particular, the oxide layer removing method includes the following broad steps of: causing a chemical reaction to take place on the surface of a silicon wafer with an oxide layer by flowing a reaction gas mixture containing a hydrogen gas in a plasma state and a fluorine-containing gas on the surface of the silicon wafer; and annealing the silicon wafer to vaporize the byproduct, i.e., a reaction layer, resulting from the chemical reaction. In addition to removing a natural oxide layer, the same method may be used for other oxide layers to be etched into oxide layer patterns.

The hydrogen gas used in the chemical reaction must be provided in a plasma state, whereas the fluorine-containing gas can be provided in either a plasma state or a non-plasma state. For example, a reaction gas mixture containing a hydrogen gas and a fluorine-containing gas mixed in a predetermined ratio may be changed into a plasma state before supplying the same to the surface of a silicon wafer, or the fluorine-containing gas in a non-plasma state can be supplied to the silicon wafer while separately supplying the hydrogen gas in a plasma state to the same. The fluorine-containing gas may be $NF_3$, $SF_6$ or $ClF_3$.

The annealing process is carried out using a heater such as a lamp or a laser. Since the purpose of the annealing process is to vaporize the byproduct, i.e., the reaction layer which accumulates on the wafer surface, for more effective annealing, the heater is installed over the silicon wafer.

When a fluorine-containing gas, for example, $NF_3$ gas, and hydrogen plasma are supplied to a silicon wafer, for example, in a ratio of 0.1:1 to 100:1 by volume, a chemical reaction takes place between the gases supplied and an oxide layer, i.e., $SiO_2$, resulting in a byproduct such as $(NF_4)_2SiF_6$, i.e., a reaction layer, on the oxide layer of the wafer. When the reaction layer grows to a certain thickness by the chemical reaction, the reaction layer acts as a barrier against the chemical reaction, thereby stopping the reaction between the gases and the oxide layer. Once the chemical reaction stops, the wafer having the reaction layer is exposed to the annealing process to vaporize the reaction layer. As a result, the reaction layer is exhausted out of the reaction chamber in vapor form, so that the oxide layer from which the reaction layer is formed is removed from the silicon wafer.

If the oxide layer to be eliminated is a natural oxide layer, performing the gas supplying process and the annealing process only once is enough to remove the natural oxide layer. However, in the case of removing oxide layers other than the natural oxide layer, which are intentionally formed, the gas supplying process and the annealing process should be repeated to completely remove the oxide layer. Here, the number of times the process is repeated is determined by the thickness of the oxide layer to be removed. Repetition is needed because the chemical reaction between the gases and the oxide layer is interrupted by the reaction layer. In other words, if the chemical reaction between the gases and the oxide layer can be controlled by an operator, the oxide layer can be removed by performing the gas supplying process and the annealing process once, irrespective of the thickness of the oxide layer to be removed. However, since the chemical reaction between the gases and the oxide layer proceeds to a certain extent, a sufficient reaction with the oxide layer is not allowed due to the reaction layer formed on the oxide layer. Thus, a desired thickness of the oxide layer cannot be removed by performing these processes once. For this reason, by performing the gas supplying and annealing processes one or more times, a desired thickness of the intentionally formed oxide layer can be removed.

In the present embodiment, the gas supplying process, which can be referred to as a chemical reaction process because it causes the chemical reaction with the oxide layer, and the annealing process, are continuously carried out in a single chamber. For example, the chemical reaction process is carried out in a lower portion of the chamber and the annealing process is carried out in an upper portion of the same chamber. In either case, the chemical reaction process and the annealing process can be continuously carried out in a plurality of process modules installed in a single chamber. For example, the chemical reaction process is carried out in a down flow module and the annealing process is carried out in an annealing module of the same chamber.

Such continuous processing performed in a single chamber contributes to a reduction in processing time, and prevents contamination by particles or generation of a secondary natural oxide layer, which may occur during a chamber-to-chamber transfer of the silicon wafer.

The embodiment of the dry cleaning technique according to the present invention differs from conventional wet cleaning techniques using a HF solution in the following. First, the HF used for cleaning in the conventional technique is in a liquid state, whereas the present invention supplies the hydrogen gas and the fluorine-containing gas in a plasma state. Therefore, the processing costs can be reduced compared to the conventional wet cleaning technique.

Second, the embodiment of the dry cleaning technique according to the present invention allows the continuous processing in a single chamber with an improved processing efficiency. Also, the overall processing time can be reduced, in addition to eliminating potential problems with the chamber-to-chamber transfer of the silicon wafer. Also, equipment used for the dry cleaning process according to the present invention is smaller than that used for the conventional wet cleaning process.

Third, the present invention is advantageous in removing an oxide layer from small, deep contact holes, compared to the conventional wet cleaning technique. In particular, since the cleaning solution used in the conventional wet cleaning technique has a predetermined viscosity, it experiences difficulties in flowing the cleaning solution in and out of small, deep contact holes. In contrast to the conventional wet cleaning technique, the present invention can avoid this problem by using the gases in a plasma state.

Fourth, the use of the gases in a plasma state allows easy process conditioning before and after the reaction. For example, the gases in a plasma state contribute to maintain the wafer surface in an optimal condition before and after the processes. Also, the gas mixture used in the embodiment of the present invention has a low selectivity with respect to various oxide layers, for example, during a contact hole cleaning process, such that the sidewall profile of the contact hole is not affected by the gas mixture.

In addition to the above advantages of the present invention, in contrast to a conventional dry cleaning method where the oxide layer is removed by breaking the molecular bonds constituting the oxide layer with a gas implantation energy, the present invention first induces the chemical reaction between the reaction gases and the oxide layer and then removes the reaction product, while avoiding damage to the underlying layer which occurs by the gas implantation energy in the conventional dry cleaning method.

First Embodiment of Semiconductor Manufacturing Apparatus (Apparatus I)

Referring to FIG. 1, an example of a semiconductor manufacturing apparatus which uses the embodiment of the oxide layer removing method according to the present invention is shown. The semiconductor manufacturing apparatus of FIG. 1 includes a vacuum chamber 10 which provides a vacuum condition, a plasma generating device 44 for producing plasma from reaction gases, a gas diffuser 50, a heater 54 installed to allow a continuous annealing process in the same chamber, a susceptor driving unit, which includes a susceptor 12, a shaft 20 and a motor M (22), for adjusting the location of a silicon wafer 14 in the vacuum chamber 10.

In particular, the susceptor 12, on which the silicon wafer 14 having an oxide layer to be etched is mounted, is installed in a lower central portion of the vacuum chamber 10. The susceptor 12, supported by the vertically movable shaft 20, moves upward and downward in the direction indicated by the arrow (see FIG. 1) by operation of the motor 22 connected to the shaft 20. A cooling line 16a is included in the susceptor 12, for supplying cooling water or cooling gas to easily control the temperature of the silicon wafer 14, which is required for ensuring process consistency. The cooling line 16a is connected to a first pipe 16 for supplying the cooling water, or gas from a cooling water/gas supply device 18. The temperature of the susceptor 12, which defines the temperature of the silicon wafer 14, is controlled by the amount of cooling water or gas supplied to the cooling line 16a of the susceptor 12.

The reaction gases for removing the oxide layer from the wafer surface by reacting with the oxide layer are supplied into the vacuum chamber 10 via the gas diffuser 50. The gas diffuser 50 includes a gas supply line 50a for receiving gases supplied via second and third pipes 32 and 34 installed outside the vacuum chamber 10, and a porous plate 50b which forms the bottom of the gas supply line 50a, for evenly diffusing the gases through the pores into the vacuum chamber 10. The second pipe 32 is for supplying the gas excited to a plasma state, and one end thereof is connected to a hydrogen gas supply source (designated with $H_2$) and a fluorine-containing gas supply source (designated with $NF_3$), wherein a switching valve 36 and a mass flow controller (MFC) 40 for controlling the amount of gas to be supplied into the vacuum chamber 10 are connected in series between the second pipe 32 and the fluorine-gas containing gas supply source, and a switching valve 38 and a MFC 42 are connected in series between the second pipe 32 and the hydrogen gas supply source. Also, a microwave guide functioning as the plasma generating device 44, for exciting the hydrogen gas and/or the fluorine-containing gas which passes through the mass flow controllers 40 and/or 42 and the switching valves 36 and/or 38 into a plasma state, is installed between the switching valves 36 and 38 and the other end of the second pipe 32. The third pipe 34 is for supplying a fluorine-containing gas in a non-plasma state, i.e., not in a plasma state, into the vacuum chamber 10. One end of the third pipe 34 is connected to a fluorine-containing gas supply source (designated with $NF_3$), and a switching valve 46 and a MFC 48 are connected between the other end of the third pipe 34 and the gas supply source.

Here, the use of the hydrogen gas supply source and the fluorine-containing gas supply sources are not limited to only the hydrogen gas and fluorine-containing gas, and the kinds of source gases may be varied according to the process to be performed in the chamber. For example, a nitrogen ($N_2$) gas and an argon (Ar) gas can be flowed into the chamber in some cases.

An exhaust hole 24 for exhausting the air or gases from the vacuum chamber 10 to maintain the vacuum condition therein is located at the lower portion of the vacuum chamber 10. The exhaust hole 24 is coupled with a fourth pipe 26 which is connected to a switching valve 28 and a vacuum pump 30 in sequence.

The pressure of the vacuum chamber 10 during supply of the reaction gases (referred to as "downflow") is automatically adjusted by a smart valve (not shown) installed at the lower portion of the vacuum chamber 10. For easy adsorption of the reaction gases to the surface of the silicon wafer 14, the pressure of the vacuum chamber 10 during the downflow must be maintained in the range of 0.1 to 10 Torr.

The heater 54, which is disposed between the gas supply line 50a and the ceiling of the vacuum chamber 10 for annealing the silicon wafer 14, is realized as a lamp or laser. Preferably, the laser is a neodymium (Nd)-YAG laser, a carbon dioxide ($CO_2$) laser, or an eximer laser.

Figure 2:
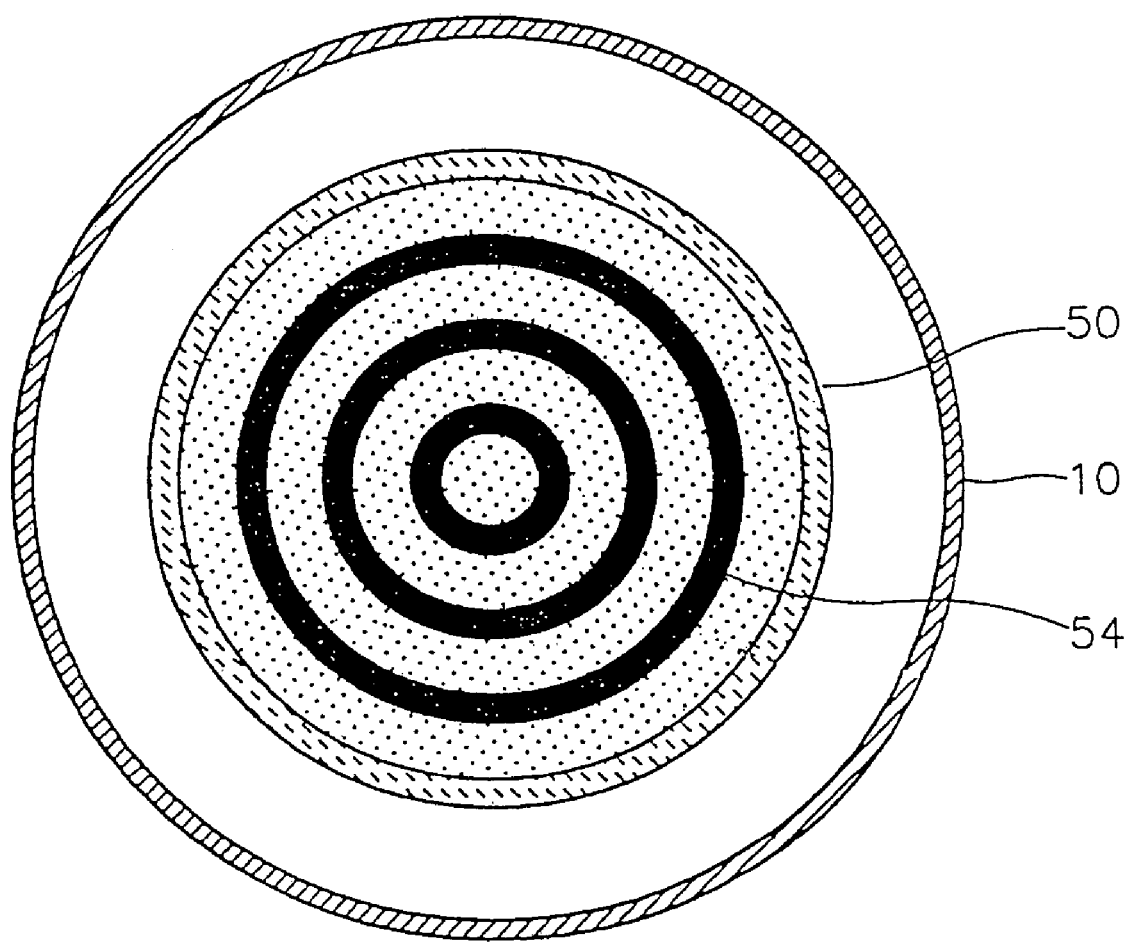
FIG. 2 is a top view of the vacuum chamber of the semiconductor manufacturing apparatus of FIG. 1.

FIG. 2 is a top view of the vacuum chamber 10 of FIG. 1. The heater 54 is arranged forming concentric circles to uniformly heat the circular silicon wafer.

Removal of Oxide Layer Using Apparatus I

In the state where the vertically movable susceptor 12 is placed at the lower portion of the vacuum chamber 10, the silicon wafer 14 is loaded onto the susceptor 12. In order to create a vacuum condition in the vacuum chamber 10, the air or gases present in the vacuum chamber 10 are exhausted via the exhaust hole 24 and the fourth pipe 26 using the switching value 28 and the vacuum pump 30. Then, cooling water and gases are supplied to the cooling line 16a in the susceptor 12 via the first pipe 16 from the cooling water/gas supply device 18, to control the temperature of the susceptor 12, i.e., the temperature of the silicon wafer 14 on the susceptor 12. The hydrogen gas and the fluorine-containing gas in a plasma state are supplied into the vacuum chamber 10 (i.e., downflowing process) for a chemical reaction with the oxide layer formed on the silicon wafer 14. When the chemical reaction no longer proceeds due to generation of a reaction layer (not shown), the susceptor 10 is moved to the upper portion of the vacuum chamber by the operation of the vertically movable shaft 20 and the motor 22. Then, the heater 54 installed at the upper portion of the vacuum chamber 10 is operated to anneal the silicon wafer 14 mounted on the susceptor 12, thereby vaporizing the byproduct of the reaction between the oxide layer and the reaction gases, i.e., the reaction layer. The vaporized byproduct is exhausted through the exhaust hole 24 and the fourth pipe 26. Then, the susceptor 12 which has been moved up from its initial position for the annealing process is moved back to the lower portion of the vacuum chamber 10 using the vertically movable shaft 20 and the motor 22.

The above processes are repeated one or more times until the oxide layer formed on the wafer surface is completely removed. The reason for the repetition has been described previously.

In the supply of the hydrogen gas and the fluorine-containing gas into the vacuum chamber 10, both the hydrogen gas and the fluorine-containing gas, which are mixed in a predetermined ratio, are changed into a plasma state and then provided into the vacuum chamber. Alternatively, only the hydrogen gas may changed into a plasma state before being supplied into the chamber, while supplying the fluorine-containing gas in a non-plasma state into the chamber.

In the former case, the mixing ratio of the fluorine-containing gas supplied from the fluorine-gas supply source and the hydrogen gas supplied from the hydrogen gas supply source is adjusted by the MFCs 40 and 42, and then supplied into the second pipe 32 via the switching valves 36 and 38. While the gas mixture passes through the microwave guide (plasma generating device 44), the gas mixture is excited to a plasma state and supplied into the gas supply line 50a connected with the second pipe 32. Then, the gas mixture in a plasma state is uniformly diffused into the vacuum chamber 10 through the pores of the porous plate 50b. For enhancing the oxide layer removal effect, an argon (Ar) gas and a nitrogen ($N_2$) gas can be additionally supplied in a plasma state into the chamber in some cases.

In the later case, the amount of the hydrogen gas supplied from the hydrogen gas supply source is adjusted by the MFC 42 and then supplied via the switching valve 38 into the second pipe 32. The hydrogen gas is excited into a plasma state while passing through the microwave guide (plasma generating device 44), and supplied into the vacuum chamber. Meanwhile, the amount of the fluorine-containing gas supplied from the fluorine-containing gas supply source that is connected with the third pipe 34 is adjusted by the MFC 48, and then supplied via the switching valve 46 into the third pipe 34. The fluorine-containing gas is supplied in a non-plasma state into the vacuum chamber 10. As in the former case, for the purpose of enhancing the oxide layer removal effect, an argon (Ar) gas and a nitrogen ($N_2$) gas can be additionally supplied in a plasma state into the chamber in some cases.

The fluorine-containing gas may be $NF_3$, $SF_6$ or $ClF_3$, and the most effective mixing ratio of the fluorine-containing gas to the hydrogen gas is in the range of 0.1:1 to 100:1 by volume.

In the oxide layer removal using Apparatus I, the downflowing process (for supplying the reaction gases) is induced at the lower portion of the vacuum chamber 10, and the annealing process is continuously carried out on the silicon wafer 14 at the upper portion of the vacuum chamber 10 with an infrared (IR) lamp or laser after the transfer of the susceptor 12 to the upper portion of the chamber. Also, the cooling line 16a improves the process consistency by controlling the temperature of the silicon wafer 14 installed at the susceptor 12, such that the temperature of the silicon wafer 14 can be evenly adjusted by the cooling line 16a and with the assistance of the cooling line related units (e.g., the first pipe 16, the cooling gas supply device 18 and a temperature regulator (not shown)). Also, Apparatus I is designed such that the pressure of the vacuum chamber 10 during the downflowing process is automatically adjusted by the smart valve (not shown), for example, in the range of 0.1 to 10 Torr.

For the oxide layer removal mechanism according to the present invention, various radicals activated from the $NF_3$ gas and the hydrogen plasma react with the oxide layer on the silicon wafer, resulting in an oxide layer that can be easily vaporized and removed from the wafer surface. Then, a N-F and Si-F series material forming the reaction layer is vaporized and removed from the wafer surface. After the oxide layer is removed from the surface of the silicon wafer, the silicon wafer is still covered with hydrogen gas.

Apparatus II

Figure 3:
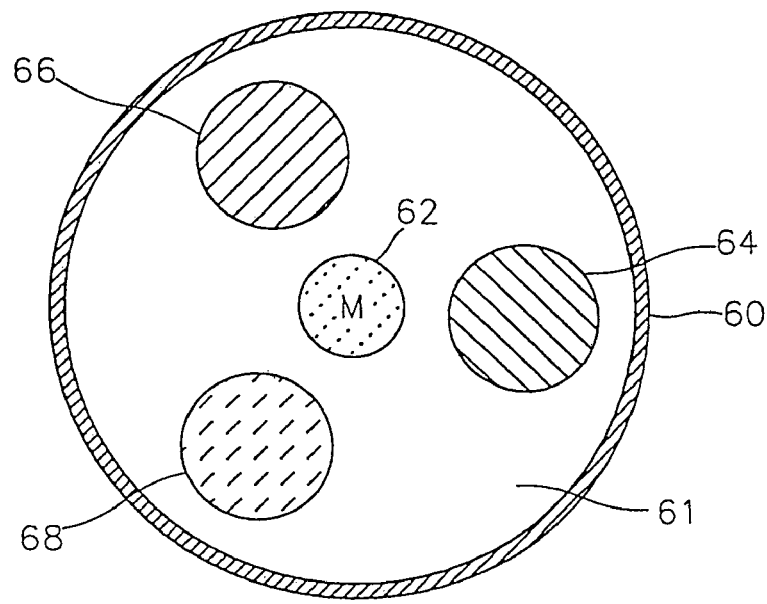
FIG. 3 is a top view of another semiconductor manufacturing apparatus which uses the oxide layer removing method according to the present invention.
Figure 4:
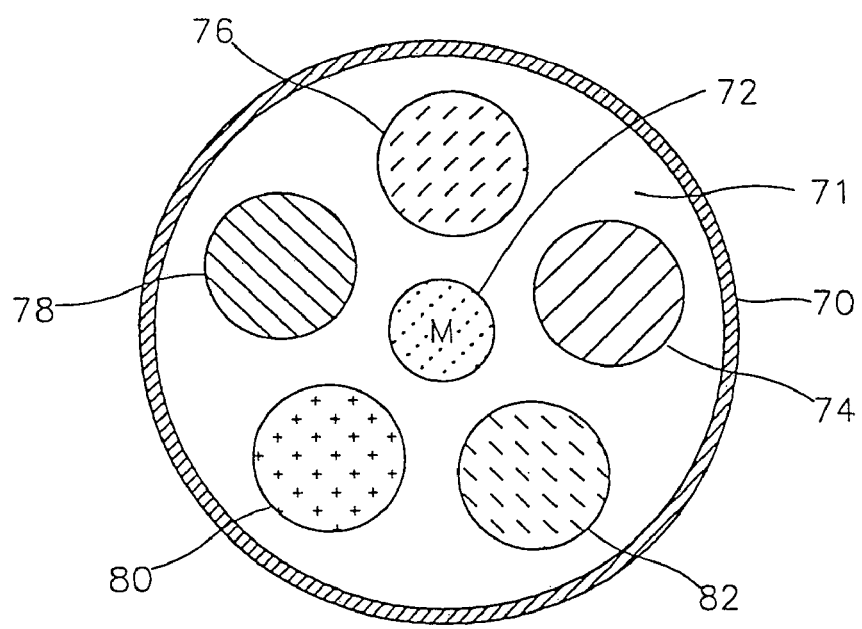
FIG. 4 is a top view of a modification of the semiconductor manufacturing apparatus shown in FIG. 3.

FIG. 3 is a top view of an another semiconductor manufacturing apparatus which uses the oxide layer removing method according to the present invention. In FIG. 3, reference numeral 60 represents a vacuum chamber, reference numeral 61 represents a rotary plate, reference numeral 62 represents a rotary motor, reference numeral 64 represents a loading/unloading and post processing module, reference numeral 66 represents a downflowing module, and reference numeral 68 represents an annealing module. FIG. 4 is a top view of a modification of the semiconductor manufacturing apparatus shown in FIG. 3, in which two downflowing modules and two annealing modules are installed in the same chamber. In FIG. 4, reference numeral 70 represents a vacuum chamber, reference numeral 71 represents a rotary plate, reference numeral 72 represents a rotary motor, reference numeral 74 represents a loading/unloading and post processing module, reference numeral 76 represents a first down flowing module, reference numeral 78 represents a first annealing module, reference numeral 80 represents a second downflowing module, and reference numeral 82 represents a second annealing module.

For FIG. 3, the rotary plate 61 is installed over the bottom of the vacuum chamber, and the rotary motor 62 for rotating the rotary plate 61 is installed at the center of the rotary plate 61. The loading/unloading and post processing module 64, the downflowing module 66 and the annealing module 68 are installed on the rotary plate around the rotary motor 62.

Also, the vacuum chamber 60 includes a vacuum system (not shown) which creates a vacuum condition for the oxide layer removal process. The rotary plate 61 is for changing the position of the silicon wafer so that an appropriate process is performed thereon. The position of the silicon wafer is shifted from one module to another module by the rotation of the rotary plate 61, which allows the downflowing and annealing processes to be performed continuously in the same chamber. The continuous downflowing and annealing processes may be repeated several times.

Figure 5:
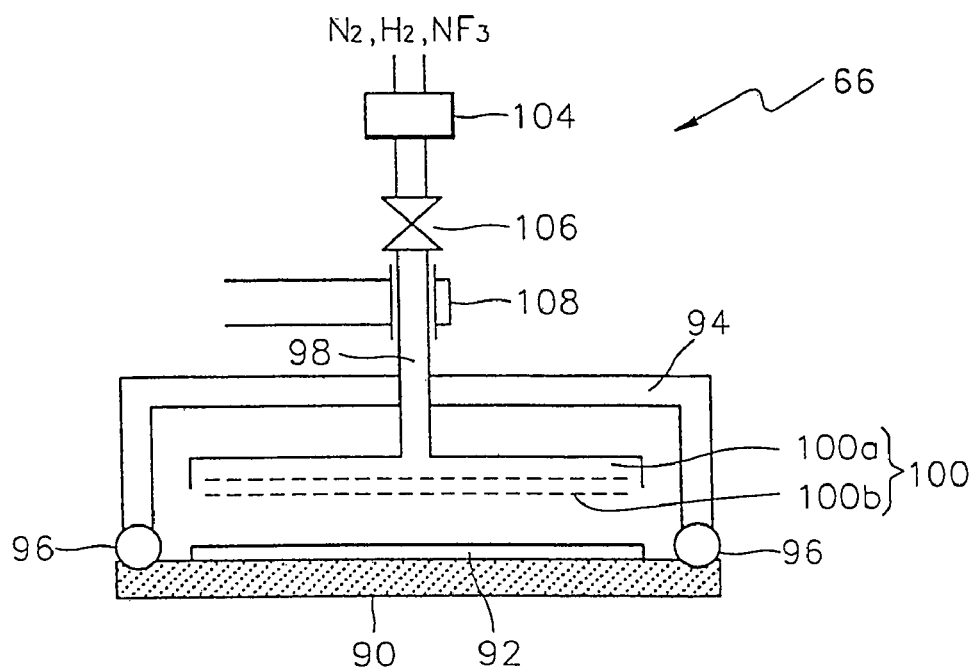
FIG. 5 is a sectional view showing the downflowing module constituting the semiconductor manufacturing apparatus shown in FIGS. 3 and 4.
Figure 6:
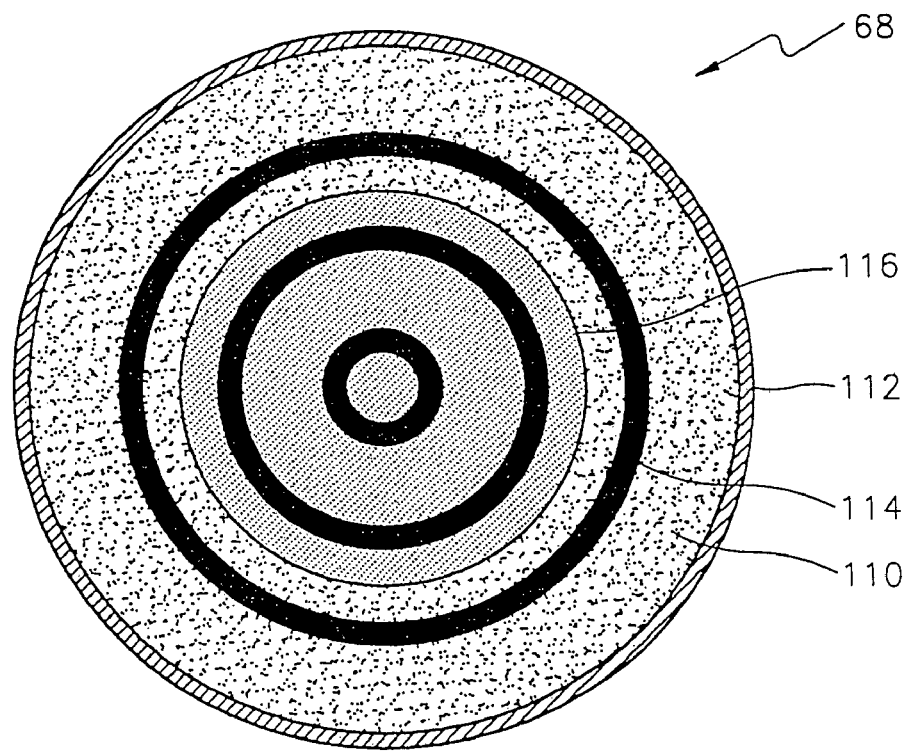
FIG. 6 is a top view of the annealing module constituting the semiconductor manufacturing apparatus shown in FIGS. 3 and 4.

FIG. 5 is a sectional view illustrating the downflowing module constituting the semiconductor manufacturing apparatus shown in FIGS. 3 and 4, and FIG. 6 is a top view of the annealing module constituting the semiconductor manufacturing apparatus shown in FIGS. 3 and 4. Referring to FIG. 5, the downflowing module 66, 76 or 80 includes a susceptor 90 installed on the rotary plate to receive a silicon wafer 92; a vertically movable downflowing chamber 94 covering the susceptor 90 to form an enclosed space; a gas diffuser 100 installed at the upper portion of the downflowing chamber 94, for supplying reaction gases to the silicon wafer 92 mounted on the susceptor 90; and a gas supply pipe 98 connected to the gas diffuser 100. To ensure smooth contact with the susceptor 90, guide rings 96 are installed at the end portions of the downflowing chamber 94.

The gas diffuser 100 includes a gas supply line 100a for receiving the reaction gases from the gas supply pipe 98, and a porous plate 100b that forms the bottom of the gas diffuser 100, for evenly diffusing the reaction gases through its pores over the entire surface of the silicon wafer 92.

One of the ends of the gas supply pipes 98 is connected to a reaction gas supply source (designated with $N_2$, $H_2$ and $NF_3$). The amount of the reaction gases supplied from the reaction gas supply source into the downflowing chamber 94 is regulated by a MFC 104 installed between the reaction gas supply source and the gas supply pipe 98, and supplied into the downflowing chamber 94 via the switching valve 106 and a microwave guide 108. The reaction gases are excited to a plasma state by the microwave guide 108 before being supplied into the downflowing chamber 94.

Referring to FIG. 6, the annealing module 68, 78 or 82 includes a susceptor 110 for receiving a silicon wafer 116, wherein the susceptor 110 occupies the entire bottom surface of the annealing module 68; a vertically movable annealing chamber 112 covering the susceptor 110 to form the space for annealing; and a heater 114 installed at the upper portion of the annealing chamber, for annealing the silicon wafer 116. To ensure smooth contact with the susceptor 110, guide rings (not shown) are installed at the end portions of the annealing chamber (refer to the installation of the guide rings 96 of the downflowing chamber 94 in FIG. 5).

The heater 114 is arranged forming concentric circles to evenly heat the circular silicon wafer 116.

In the oxide layer removal using the plasma state reaction gases including the hydrogen gas and the fluorine-containing gas, during the downflowing process a reaction layer of $(NF_4)_2SiF_6$ is formed by the chemical reaction between the reaction gas mixture and the oxide layer at the surface of the silicon wafer, and the reaction layer is removed by the subsequent annealing process. The reaction layer acts as a barrier against the chemical reaction, limiting the amount of oxide layer that is removed by the subsequent annealing process. Thus, the downflowing and annealing processes must be carried out one or more times to remove a desired amount of the oxide layer. In the case of using Apparatus I shown in FIGS. 1 and 2 to remove the oxide layer, where the downflowing process is carried out on the silicon wafer at the lower portion of the vacuum chamber and then the silicon wafer is moved up to the upper portion of the same chamber for the annealing process, the temperature of the vacuum chamber may be unstable, and it is difficult to constantly maintain the temperature of the silicon wafer for each process. In addition, the particles generated during the process may cause problems on the silicon wafer.

To avoid these problems, Apparatus II having the separate downflowing and annealing modules within the same vacuum chamber has been suggested. The downflowing and annealing processes are separately carried out in the different modules, while avoiding the influence between the difference processes.

Also, Apparatus II allows the downflowing and annealing processes to be repeated continuously within the same chamber, so that the amount of etching of the oxide layer can be increased, thus improving the throughput of the semiconductor manufacturing process. The separate downflowing and annealing processes are advantageous in view of process consistency and stability.

Removal of Oxide Layer by Using Apparatus II

Referring to FIGS. 3, 5 and 6, the silicon wafer 92 is loaded onto the susceptor 90 positioned in the loading/unloading and post-process module 64 installed on the rotary plate 61 of the vacuum chamber 60. The rotary motor 62 installed at the center of the rotary plate 61 is operated to move the susceptor 90 into the downflowing module 66, and in particular, into the lower portion of the downflowing chamber 94. Then, the downflowing chamber 94 is moved downward so that it contacts with the susceptor 90 and is made air-tight with the guide rings 96. The hydrogen gas and the fluorine-containing gas in a plasma state are supplied into the downflowing chamber 94 to cause a chemical reaction with an oxide layer (not shown) formed on the surface of the silicon wafer 92, resulting in a reaction layer. The downflowing chamber 94 is moved upward apart from the susceptor 90, and the susceptor 90 is moved into the lower portion of the annealing chamber 112 in the annealing module 68 by the operation of the rotary motor 62. The annealing chamber 112 is moved downward so that it contacts with the susceptor 90 and is made air-tight with the guide rings. Then, the silicon wafer is annealed by the heater 114 installed at the upper portion of the annealing chamber 112, thus vaporizing the reaction layer. The reaction layer, i.e., the reaction byproduct, is vaporized and exhausted out of the chamber. After the annealing chamber 112 is moved upward and apart from the susceptor 90, the susceptor 90 in the annealing module is moved into the lower portion of a loading/unloading and post-processing chamber (not shown) of the loading/unloading and post-processing module 64. Then, the loading/unloading and post-processing chamber is moved downward so that it contacts with the rotary plate and is made air-tight with guide rings attached to the end portions of the loading/unloading and post-processing chamber. In some cases, the surface of the silicon wafer may be exposed to hydrogen gas in a post-process to form a protective layer thereon. Then, the silicon wafer is unloaded from the vacuum chamber 60.

By repeating one or more times the processes from moving the susceptor 90 into the lower portion of the downflowing chamber 94 and to exhausting the vaporized reaction layer from the silicon wafer, a desired amount of the oxide layer can be removed.

The fluorine-containing gas used together with the hydrogen gas to induce the chemical reaction with the oxide layer such that it is removed may be $NF_3$, $SF_6$ or $SiF_3$. Also, the mixing ratio of the fluorine-containing gas to the hydrogen gas is in the range of 0.1:1 to 100:1 by volume. The heater 114 used for the annealing is a lamp or a laser.

Method for Forming Dual (Or Triple) Gate Oxide Layer Using An Embodiment of the Oxide Layer Removing Method According to the Present Invention As semiconductor devices have a high-density and high-function, there is an increasing need for one-chip devices in which a memory device and a logic device are merged. However, the problem with such one-chip devices is the complicated manufacturing process needed to produce its intricate structure. In particular, a logic device requires a gate oxide layer which is thin enough so that the device has a high operating speed. However, such a thin gate oxide layer for a DRAM is especially susceptible to damage, and thus the DRAM requires a thick gate oxide layer in contrast to the logic device.

For this reason, a method of forming a dual (or triple) gate oxide layer is used in the manufacture of one-chip devices.

According to a conventional technique for forming a dual gate oxide layer, in patterning a first gate oxide layer, a general dry etching technique is used, which deteriorates the underlying layer of the first gate oxide layer and in turn a second gate oxide layer.

FIGS. 7A through 7E are sectional views sequentially illustrating the dual gate oxide layer formation by the gate oxide removing method according to the present invention.

After a first gate oxide layer 122 is formed on a silicon wafer 120 (see FIG. 7A), etch barrier patterns 124 formed of, for example, photoresist, are formed on the first gate oxide layer 122. Then, the first gate oxide layer 122 exposed between the etch barrier patterns 124 is removed by the oxide layer removing method according to the present invention. In particular, the hydrogen gas and the fluorine-containing gas in a plasma state are supplied onto the first gate oxide layer 122 exposed between the etch barrier patterns 124 to induce a chemical reaction with the first gate oxide layer 122, and then exposed to the annealing process, thus vaporizing a byproduct generated by the chemical reaction. The gas supplying and annealing process are repeated until none of the first gate oxide layer 122 remains on the semiconductor substrate (see FIG. 7B).

Figure 7A:
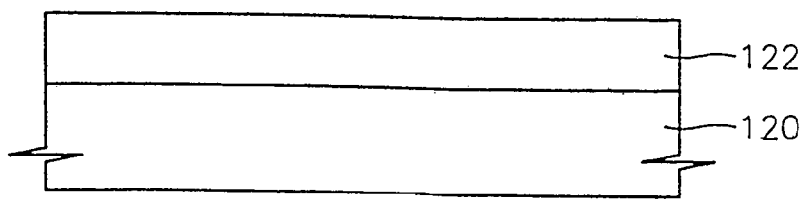
FIGS. 7A through 7E are sectional views sequentially illustrating the formation of a dual gate oxide layer by using the oxide layer removing method according to the present invention.
Figure 7B:
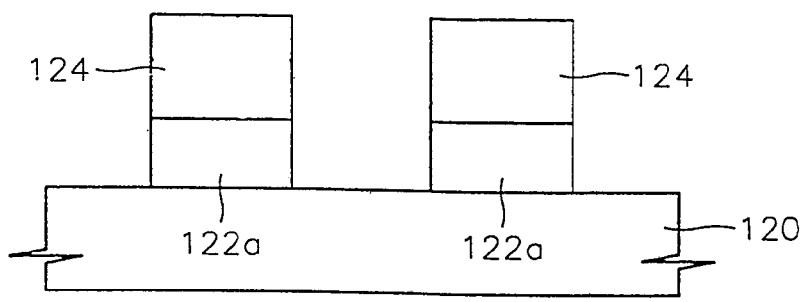
Figure 7C:
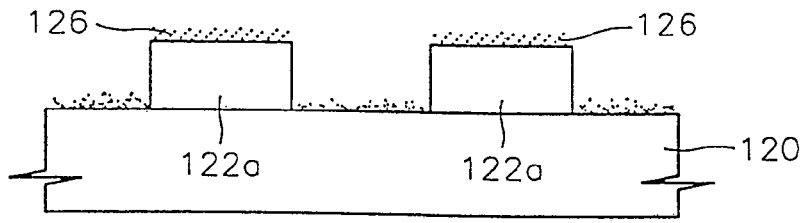
Figure 7D:
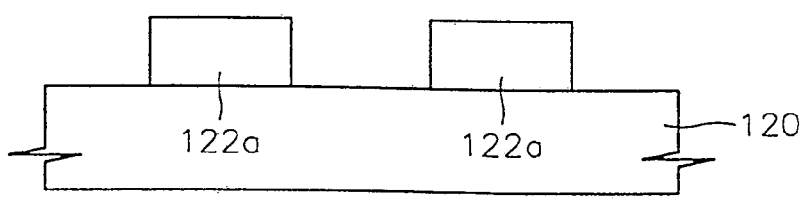
Figure 7E:
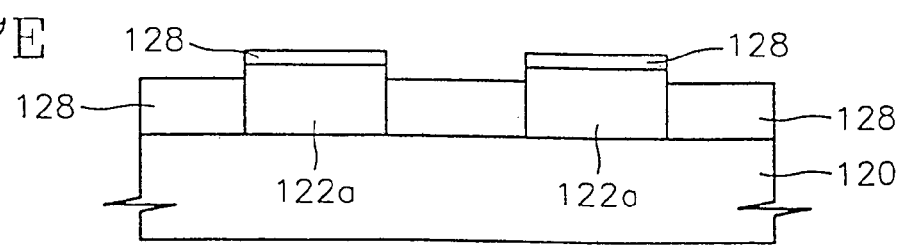

Then, the etch barrier patterns 124 are removed and the silicon wafer 120 with the first gate oxide layer patterns 122a is treated with a solution, for example, SC1 solution, which is able to remove organic particles that may be present on the wafer surface, resulting in a natural oxide layer 126 on the first gate oxide layer patterns (see FIG. 7C). The natural oxide layer 126 is also removed by the above-mentioned gas supplying and annealing processes (see FIG. 7D). Subsequently, a second gate oxide layer 128 is formed on the first gate oxide layer patterns 122a and on the silicon wafer exposed between the first gate oxide layer patterns 122a (see FIG. 7E).

In the formation of the dual gate oxide layer using Apparatus I, the silicon wafer on which the first gate oxide layer and the etch barrier patterns have been formed is loaded onto the vertically movable susceptor, which is positioned at the lower portion of the vacuum chamber. Then, the hydrogen gas and the fluorine-containing gas in a plasma state are flowed into the vacuum chamber to cause a chemical reaction with the first gate oxide layer exposed between the etch barrier patterns. Then, the susceptor is moved up to the upper portion of the vacuum chamber to anneal the silicon wafer with the heater, thus vaporizing a byproduct resulting from the chemical reaction between the reaction gases and the oxide layer. The gas supplying and annealing processes are repeated until the gate oxide layer is completely etched.

Then, the etch barrier patterns are removed and then exposed to a chemical treatment to remove organic particles which may be present on the silicon wafer, resulting in a natural oxide layer. The natural oxide layer is removed by the processes that were used to remove the first gate oxide layer, and a second gate oxide layer is formed on the first oxide layer patterns and on the silicon wafer 120 exposed between the first oxide layer patterns.

It is appreciated that the formation of the dual gate oxide layer using Apparatus II can be understood by those skilled in the art with reference to the formation of the dual gate oxide layer using Apparatus I and the oxide layer removal using Apparatus II, which have already been described.

The oxide layer removing method and the apparatus using the same according to the present invention can remove the oxide layer with a high selectivity, while avoiding damage or contamination of the underlying layer.

In the specification, there have been disclosed typical preferred embodiments of the invention and, although the substrate having an oxide layer is disclosed as being a silicon wafer, it is used in a generic and descriptive sense only and not for purposes of limitation, the scope of the invention being set forth in the following claims.

What is claimed is :

1. A method of removing an oxide layer using a semiconductor manufacturing apparatus, comprising:

(a) placing a vertically movable susceptor at a lower portion of a processing chamber and loading a wafer onto the vertically movable susceptor;

(b) supplying a cooling water or cooling gas into a cooling line in the susceptor to adjust a temperature of the wafer;

(c) flowing a hydrogen gas in a plasma state and a fluorine-containing gas into the processing chamber to induce a chemical reaction with the oxide layer on the wafer;

(d) moving the susceptor up to an upper portion of the processing chamber;

(e) annealing the wafer mounted on the susceptor with a heater installed at the upper portion of the processing chamber to vaporize a byproduct resulting from the chemical reaction; and (f) exhausting the vaporized byproduct out of the processing chamber.

2. The method of claim 1, wherein after the step (f), the susceptor is moved back to the lower portion of the chamber and steps (b) to (f) are repeated one or more times.

3. The method of claim 1, wherein during the supplying the hydrogen gas in a plasma state and the fluorine-containing gas into the processing chamber, the hydrogen gas and the fluorine-containing gas are mixed in a predetermined ratio, changed into a plasma state, and then supplied into the processing chamber.

4. The method of claim 1, wherein during the supplying the hydrogen gas in a plasma state and the fluorine-containing gas into the processing chamber, the hydrogen gas is supplied in a plasma state into the processing chamber and the fluorine-containing gas is supplied in a non-plasma state into the processing chamber.

5. The method of claim 1, wherein the fluorine-containing gas is selected from the group consisting of $NF_3$, $SF_6$ and $ClF_3$.

6. The method of claim 1, wherein the mixing ratio of the fluorine-containing gas to the hydrogen gas is in a range of 0.1:1 to 100:1 by volume.

7. The method of claim 1, wherein the gas mixture containing the hydrogen gas and the fluorine-containing gas in a predetermined ratio is supplied in a plasma state into the processing chamber together with a nitrogen gas ($N_2$) and an argon gas (Ar).

8. The method of claim 1, wherein annealing the wafer is carried out using one of a lamp and laser.

9. The method of claim 8, wherein the laser is selecting from a group consisting of a neodymium (Nd)-YAG laser, a carbon dioxide ($CO_2$) laser, and an eximer laser.

10. A method of forming a dual gate oxide layer for a semiconductor device using a method of removing an oxide layer, comprising:

(a) forming a first gate oxide layer on a silicon wafer;

(b) forming etch barrier patterns on the first gate oxide layer;

(c) repeating the steps of:

placing a vertically movable susceptor at the lower portion of a processing chamber and loading the wafer onto the vertically movable susceptor placed at the lower portion of the processing chamber;

flowing a hydrogen gas in a plasma state and a fluorine-containing gas into the processing chamber to induce a chemical reaction with the first gate oxide layer exposed between the etch barrier patterns;

moving the susceptor up to an upper portion of the processing chamber; and annealing the wafer mounted on the susceptor with a heater installed at the upper portion of the processing chamber to vaporize a byproduct resulting from the chemical reaction, until the first gate oxide layer exposed between the etch barrier patterns is completely removed;

(d) removing the etch barrier patterns;

(e) chemically treating the surface of the wafer with a solution to remove organic particles which may be present on the wafer surface, and performing the step (c) to remove a natural oxide layer resulting from the step (d) and the chemical treatment; and (f) forming a second gate oxide layer on the structure obtained in the step (e).

11. The method of claim 10, wherein the etch barrier patterns are photoresist patterns covering a region of the first gate oxide layer to be the dual gate oxide layer.

12. A method of removing an oxide layer using the semiconductor manufacturing apparatus, the method comprising:

(a) loading a wafer onto a susceptor in a loading/unloading and post-processing module installed on a rotary plate of a processing chamber;

(b) operating a rotary motor installed at the center of the rotary plate to move the susceptor into a lower portion of a downflowing chamber in a downflowing module;

(c) moving the downflowing chamber down so that it contacts with the susceptor and the downflowing chamber thereby forming an air tight seal;

(d) supplying a hydrogen gas in a plasma state and a fluorine-containing gas into the downflowing chamber to induce a chemical reaction with the oxide layer on the wafer;

(e) moving the downflowing chamber up to an upper portion of the downflowing module apart from the susceptor, and moving the susceptor into the lower portion of an annealing chamber in an annealing module;

(f) moving the annealing chamber down so that is contacts with the rotary plate and the annealing chamber thereby forming an air tight seal;

(g) annealing the wafer with a heater installed at the upper portion of the annealing chamber to vaporize a byproduct resulting from the chemical reaction between the reactions gas and the oxide layer on the wafer; and (h) exhausting the vaporized byproduct out of the annealing chamber.

13. The method of claim 12, after the step (f) further comprising:

moving the annealing chamber up to the upper portion of the annealing module apart from the susceptor;

moving the susceptor into the lower portion of a loading/unloading and post-processing chamber in the loading/unloading and post-processing module;

moving the loading/unloading and post-processing chamber down so that it contacts with the susceptor and the loading/unloading and post-processing chamber is made airtight; and post-treating the wafer with the hydrogen gas.

14. The method of claim 12, wherein the steps (b) to (h) are sequentially repeated one or more times.

15. The method of claim 12, wherein the fluorine-containing gas is one selected from the group consisting of NF3, SF6 and ClF3.

16. The method of claim 12, wherein the mixing ratio of the fluorine-containing gas to the hydrogen gas is in the range of 0.1:1 to 100:1 by volume.

17. The method of claim 12, wherein the heater is one of a lamp and a laser.

18. A method of forming a dual gate oxide layer for a semiconductor device using the method of removing an oxide layer, comprising the steps of:

(a) forming a first gate oxide layer on a silicon wafer;

(b) forming etch barrier patterns on the first gate oxide layer;

(c) repeating the steps of:

flowing a hydrogen gas in a plasma state and a fluorine-containing gas into the processing chamber to induce a chemical reaction with the first gate oxide layer exposed between the etch barrier patterns; and annealing the wafer to vaporize the byproduct resulting from the chemical reaction, until the first gate oxide layer exposed between the etch barrier patterns is completely removed;

(d) removing the etch barrier patterns;

(e) chemically treating the surface of the wafer with a solution to remove organic particles which may be present on the wafer surface;

(f) performing the step (c) to remove a natural oxide layer resulting from the steps (d) and (e); and (g) forming a second gate oxide layer on the structure obtained in the step (f).

19. The method of claim 18, wherein the etch barrier patterns are photoresist patterns covering a region of the first gate oxide layer to be the dual gate oxide layer.

* * * * *